US007408376B2

(12) United States Patent
Chang

(10) Patent No.: US 7,408,376 B2
(45) Date of Patent: Aug. 5, 2008

(54) ARRAY SUBSTRATE

(75) Inventor: Jong-Woong Chang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 168 days.

(21) Appl. No.: 11/327,112

(22) Filed: Jan. 6, 2006

(65) Prior Publication Data

US 2006/0145996 A1 Jul. 6, 2006

(30) Foreign Application Priority Data

Jan. 6, 2005 (KR) ..................... 10-2005-0001223

(51) Int. Cl.
*G01R 31/00* (2006.01)

(52) U.S. Cl. ..................................................... 324/770

(58) Field of Classification Search ....................... None
See application file for complete search history.

(56) References Cited

U.S. PATENT DOCUMENTS 5,546,013 A * 8/1996 Ichioka et al. .............. 324/770
6,392,719 B2 * 5/2002 Kim ............................ 349/40
6,734,925 B1 * 5/2004 Lee et al. ...................... 349/40
6,839,121 B2 * 1/2005 Kim et al. ................... 349/152

* cited by examiner

*Primary Examiner*—Vinh P Nguyen
(74) *Attorney, Agent, or Firm*—MacPherson Kwok Chen & Heid LLP

(57) ABSTRACT

In an array substrate and a display apparatus having the array substrate, a pixel part includes gate lines, data lines and pixels electrically connected to the gate and data lines. A gate driving circuit is electrically connected to a first end of the gate lines and applies a gate signal to the gate lines. A first inspecting circuit is electrically connected to odd-numbered gate lines of the gate lines and inspects odd-numbered pixels connected to the odd-numbered gate lines. A second inspecting circuit is electrically connected to even-numbered gate lines of the gate lines and inspects even-numbered pixels connected to the even-numbered gate lines. Thus, electrical defects between the pixels may be easily detected, thereby improving the inspectability for the defects of the array substrate.

16 Claims, 7 Drawing Sheets

101

ARRAY SUBSTRATE

CROSS-REFERENCE TO RELATED APPLICATIONS

This application relies for priority upon Patent Application No. 2005-1223 filed in the Korean Intellectual Property Office, Republic of Korea, on Jan. 6, 2005, the entire content of which is hereby incorporated herein by reference.

BACKGROUND OF THE INVENTION

1. Field of the Invention

The present invention relates to an array substrate and a display apparatus having the same. More particularly, the present invention relates to an array substrate having improved inspectability and a display apparatus having the improved array substrate.

2. Description of the Related Art

In general, a liquid crystal display apparatus includes a liquid crystal display panel displaying an image thereon and a driver unit for controlling the liquid crystal display panel. A liquid crystal display panel typically includes a lower substrate, an upper substrate facing the lower substrate, and a liquid crystal layer disposed between the lower and upper substrates. The lower substrate includes a plurality of gate lines, a plurality of data lines and a plurality of pixels. The driver unit includes a gate driver and a data driver. The gate driver is electrically connected to the gate lines in order to output a gate signal to the gate lines in sequence, while the data driver is electrically connected to the data lines in order to output a data signal to the data lines in sequence.

Recently, some liquid crystal displays employ a structure where the gate driver is essentially formed simultaneously with the pixels on an end of the lower substrate by a thin film process. However, when the lower substrate is inspected after the gate driver is formed at the lower substrate, the source and location of a defect may not be detected accurately.

SUMMARY OF THE INVENTION

In accordance with one or more embodiments, the present invention provides an array substrate having improved inspectability and a display apparatus having the improved array substrate. In one aspect of the present invention, an array substrate includes a substrate member, a pixel part, a gate driving circuit, a first inspecting circuit and a second inspecting circuit. The pixel part is formed on the substrate member and includes a plurality of gate lines, a plurality of data lines, and a plurality of pixels that are electrically connected to the gate lines and data lines. The gate lines include odd-numbered gate lines and even-numbered gate lines, while the pixels include odd-numbered pixels and even-numbered pixels. The gate driving circuit is electrically connected to a first end of the gate lines and formed on the substrate adjacent to the pixel part so as to apply a gate signal to the gate lines. The first inspecting circuit is electrically connected to the odd-numbered gate lines and inspects the odd-numbered pixels that are connected to the odd-numbered gate lines. The second inspecting circuit is electrically connected to the even-numbered gate lines and inspects the even-numbered pixels connected to the even-numbered gate lines.

In another aspect of the present invention, a display apparatus includes an array substrate and an opposite substrate coupled to the array substrate. The array substrate includes a substrate member, a pixel part, a gate driving circuit, a first inspecting circuit and a second inspecting circuit. The pixel part is formed on the substrate member and includes a plurality of gate lines, a plurality of data lines, and a plurality of pixels that are electrically connected to the gate lines and data lines. The gate lines include odd-numbered gate lines and even-numbered gate lines, while the pixels include odd-numbered pixels and even-numbered pixels. The gate driving circuit is electrically connected to a first end of the gate lines and formed on the substrate adjacent to the pixel part so as to apply a gate signal to the gate lines. The first inspecting circuit is electrically connected to the odd-numbered gate lines and inspects the odd-numbered pixels that are connected to the odd-numbered gate lines. The second inspecting circuit is electrically connected to the even-numbered gate lines and inspects the even-numbered pixels that are connected to the even-numbered gate lines.

As described above, the first and second inspecting circuits inspect the odd-numbered gate lines and the even-numbered gate lines, respectively. Thus, electrical defects between the pixels may be easily detected, thereby improving the inspectability for the defects of the array substrate.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

Figure 1:
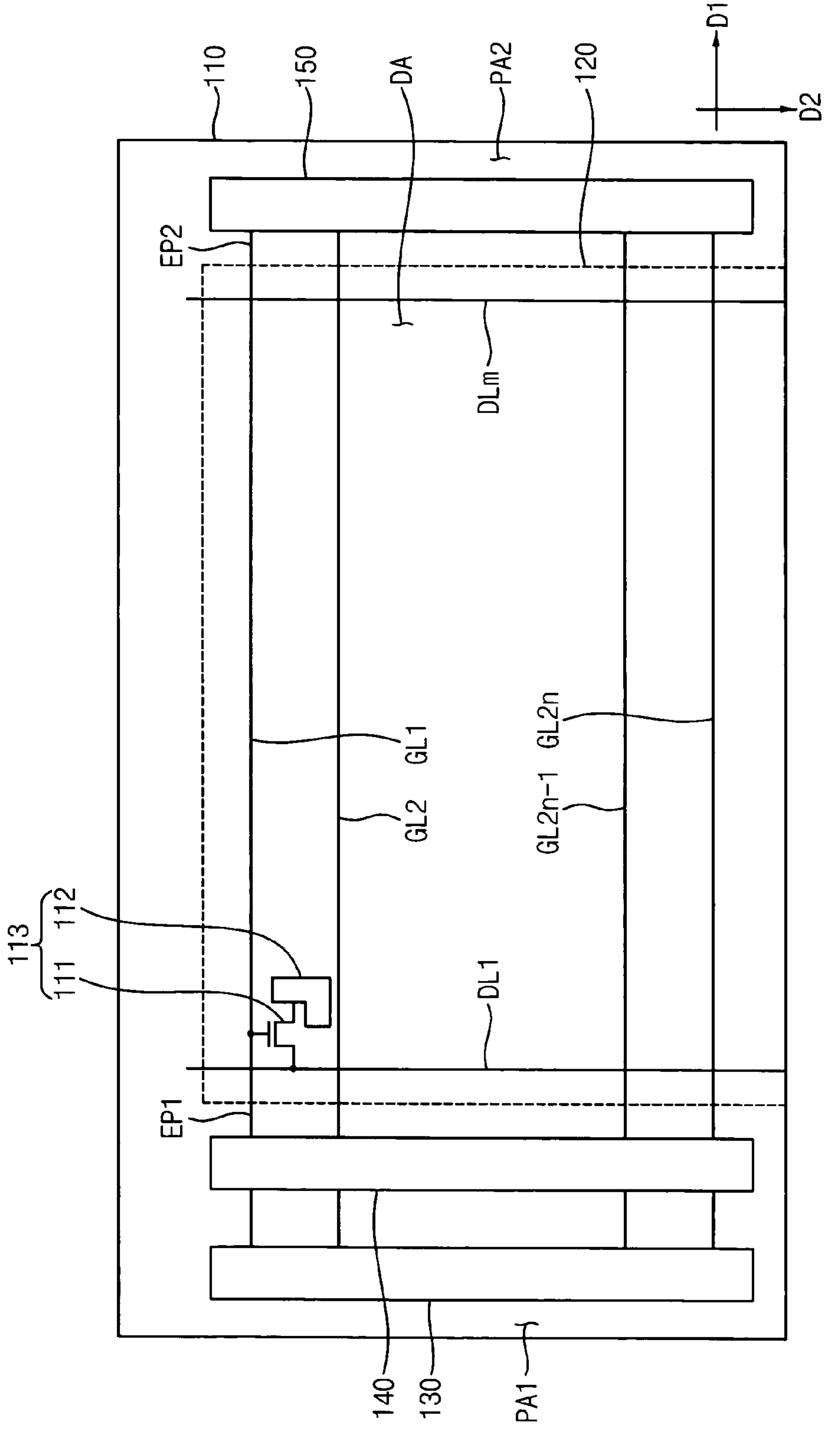
FIG. 1 is a plan view showing an array substrate according to an exemplary embodiment of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention as claimed to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, embodiments of the present invention will be explained in detail with reference to the accompanying drawings.

FIG. 1 is a plan view showing an array substrate according to an exemplary embodiment of the present invention. Referring now to FIG. 1, an array substrate 101 includes a substrate member 110, a pixel part 120, a gate driving circuit 130, an inspecting circuit 140 and a discharge circuit 150. The substrate 110 includes a display area DA, a first peripheral area PA1 and a second peripheral area PA2. The pixel part 120 is formed in the display area DA of the substrate 110. The pixel part 120 includes first to 2n-th gate lines GL1 to GL2n, first to m-th data lines DL1 to DLm and a plurality of pixels 113. The first to 2n-th gate lines GL1 to GL2n extend in a first direction D1 and are substantially parallel to each other, and the first to m-th data lines DL1 to DLm extend in a second direction D2 and are substantially parallel to each other. The first to 2n-th gate lines GL1 to GL2n cross, and are insulated from, the first to m-th data lines DL1 to DLm. Each of the pixels 113 includes a thin film transistor 111 and a pixel electrode 112. In the present embodiment, the thin film transistor 111 includes a gate electrode electrically connected to the first gate line GL1, a source electrode electrically connected to the first data line DL1 and a drain electrode electrically connected to the pixel electrode 112.

The first peripheral area PA1 is adjacent to a first end EP1 of the first to 2n-th gate lines GL1 to GL2n. The gate driving circuit 130 and the inspecting circuit 140 are formed in the first peripheral area PA1. The gate driving circuit 130 is electrically connected to the first end EP1 of the first to 2n-th gate lines GL1 to GL2n. The gate driving circuit 130 sequentially outputs the gate signal to the first to 2n-th gate lines GL1 to GL2n while the array substrate 101 is driven. Thus, the pixels connected to the first to 2n-th gate lines GL1 to GL2n are sequentially turned on in response to the gate signal. The inspecting circuit 140 is electrically connected to the first end EP1 of the first to 2n-th gate lines GL1 to GL2n. The inspecting circuit 140 outputs a first driving voltage to odd-numbered gate lines GL1 to GL2n−1 during a first inspection operation for the odd-numbered gate lines GL1 to GL2n−1 of the first to 2n-th gate lines GL1 to GL2n. Thus, odd-numbered pixels electrically connected to the odd-numbered gate lines GL1 to GL2n−1 are turned on in response to the first driving voltage during the first inspection. The inspecting circuit 140 outputs a second driving voltage to even-numbered gate lines GL2 to GL2n during a second inspection for the even-numbered gate lines GL2 to GL2n of the first to 2n-th gate lines GL1 to GL2n. Thus, even-numbered pixels electrically connected to the even-numbered gate lines GL2 to GL2n are turned on in response to the second driving voltage during the second inspection.

The second peripheral area PA2 is adjacent to a second end EP2 of the first to 2n-th gate lines GL1 to GL2n. The discharge circuit 150 is formed in the second peripheral area PA2. The discharge circuit 150 outputs the second driving voltage to the even-numbered gate lines GL2 to GL2n during the first inspection, thereby turning off the even-numbered pixels. In contrast, the discharge circuit 150 outputs the second driving voltage to the odd-numbered gate lines GL1 to GL2n−1 during the second inspection, thereby turning off the odd-numbered pixels.

Figure 2:
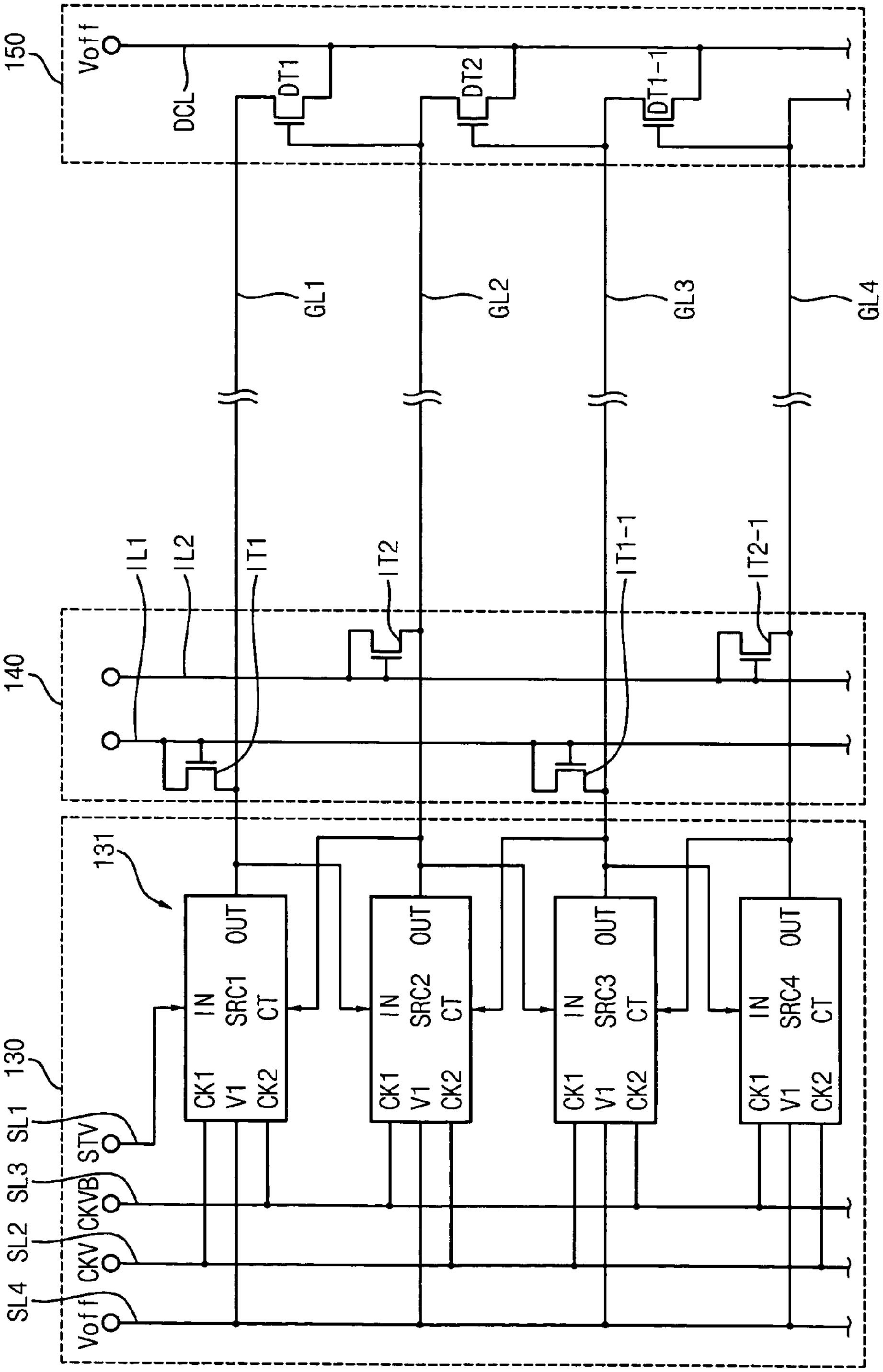
FIG. 2 is a circuit diagram showing a gate driving circuit, an inspecting circuit and a discharge circuit according to the exemplary embodiment of FIG. 1.
Figure 3:
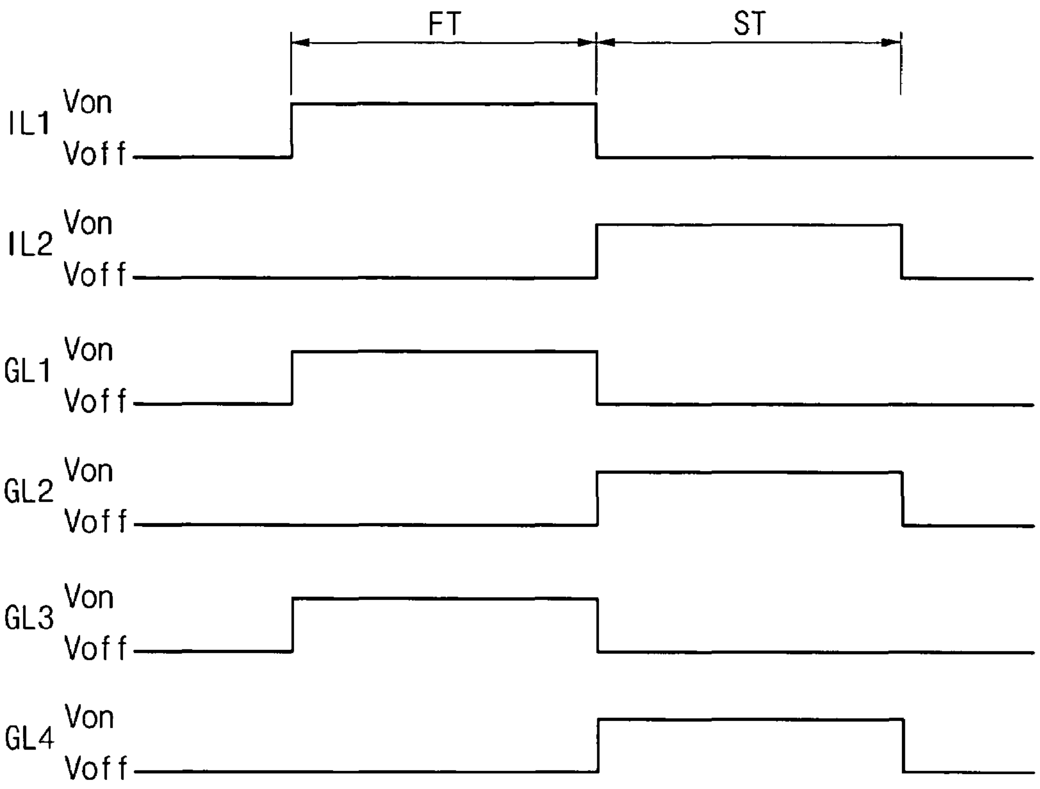
FIG. 3 is an input/output waveform diagram of the inspecting circuit according to the exemplary embodiment of FIG. 2.

FIG. 2 is a circuit diagram showing a gate driving circuit, an inspecting circuit and a discharge circuit according to the exemplary embodiment of FIG. 1, while FIG. 3 is an input/output waveform diagram of the inspecting circuit according to the exemplary embodiment of FIG. 2. Referring now to FIG. 2, the gate driving circuit 130 includes a shift register 131, a first signal line SL1, a second signal line SL2, a third signal line SL3 and a fourth signal line SL4. The shift register 131 includes first, second, third and fourth stages SRC1, SRC2, SRC3 and SRC4 connected in series. The first, second, third and fourth stages SRC1, SRC2, SRC3 and SRC4 are in one-to-one relation with and electrically connected to the first, second, third and fourth gate lines GL1, GL2, GL3 and GL4, respectively.

Each of the first, second, third and fourth stages SRC1, SRC2, SRC3 and SRC4 includes an input terminal IN, an output terminal OUT, a first clock terminal CK1, a second clock terminal CK2, a power voltage terminal V1 and a control terminal CT. The output terminal OUT is electrically connected to a corresponding gate line. The input terminal IN is electrically connected to the output terminal OUT of a previous stage, while the control terminal CT is electrically connected to the output terminal OUT of a following stage.

The first signal line SL1 receives a start signal STV and is electrically connected to the input terminal IN of the first stage SRC1. The second and third signal lines SL2 and SL3 receive a first clock CKV and a second clock CKVB, respectively. In the present embodiment, the first and second clocks CKV and CKVB have different phases from each other. More particularly, the first and second clocks CKV and CKVB have opposite phases to each other. The second signal line SL2 is electrically connected to a first clock terminal CK1 of odd-numbered stages SRC1 and SRC3 of the first to fourth stages SCR1 to SCR4 and a second clock terminal CK2 of even-numbered stages SRC2 and SRC4 of the first to fourth stages SCR1 to SCR4. The third signal line SL3 is electrically connected to the second clock terminal CK2 of the odd-numbered stages SRC1 and SRC3 of the first to fourth stages SCR1 to SCR4 and the first clock terminal CK1 of the even-numbered stages SRC2 and SRC4 of the first to fourth stages SCR1 to SCR4. A first driving voltage, Von, corresponds to a logic-high level (e.g. Vdd), while a second driving voltage, Voff, corresponds to a logic-low level (e.g. Vss). The fourth signal line SL4 receives the second driving voltage Voff and is electrically connected to the power voltage terminal V1 of the first, second, third and fourth stages SRC1, SRC2, SRC3 and SRC4. In this manner, the gate driving circuit 130 includes a plurality of stages electrically connected to the gate lines, and the stages are connected in series to sequentially output the gate signal to a corresponding gate line.

The inspecting circuit 140 includes a first switching device IT1, a second switching device IT2, a first inspecting line IL1 and a second inspecting line IL2. The first and second inspecting lines IL1 and IL2 extend in a substantially perpendicular direction to the first to fourth gate lines GL1 to GL4 and are insulated from the first to fourth gate lines GL1 to GL4. The first switching device IT1 is electrically connected to the first inspecting line IL1, and the second switching device IT2 is electrically connected to the second inspecting line IL2. The first switching device IT1 is electrically connected to the first end EP1 of the odd-numbered gate lines GL1 and GL3 of the first to fourth gate lines GL1 to GL4, as shown in FIG. 1. The second switching device IT2 is electrically connected to the first end EP1 of the even-numbered gate lines GL2 and GL4 of the first to fourth gate lines GL1 to GL4, as shown in FIG. 1. More particularly, a gate electrode and a drain electrode of the first switching device IT1 are electrically connected to the first inspecting line IL1, and a source electrode of the first switching device IT1 is electrically connected to the first gate line GL1 or the third gate line GL3. A gate electrode and a drain electrode of the second switching device IT2 are electrically connected to the second inspecting line IL2, and a source electrode of the second switching device IT2 is electrically connected to the second gate line GL2 or the fourth gate line GL4.

In reference to FIGS. 2 and 3, the first and second inspecting lines IL1 and IL2 receive the first driving voltage Von and the second driving voltage Voff, respectively, for a first inspection (period) FT in which the odd-numbered gate lines GL1 and GL3 are inspected. During the first inspection FT, the first switching device IT1 (IT1-1) outputs the first driving voltage Von onto the odd-numbered gate lines GL1 and GL3 in response to the first driving voltage Von from the first inspecting line IL1. Thus, the odd-numbered pixels connected to the odd-numbered gate lines GL1 and GL3 are turned on in response to the first driving voltage Von. As shown, the second switching device IT2 is turned off in response to the second driving voltage Voff during the first inspection FT. Then, the second and first inspecting lines IL2 and IL1 receive the first and second driving voltages Von and Voff, respectively, during a second inspection (period) ST in which the even-numbered gate lines GL2 and GL4 are inspected. During the second inspection ST, the second switching device IT2 (IT2-1) outputs the first driving voltage Von to the even-numbered gate lines GL2 and GL4 in response to the first driving voltage Von from the second inspecting line IL2. Thus, the even-numbered pixels connected to the even-numbered gate lines GL2 and GL4 are turned on.

The first switching device IT1 is turned off in response to the second driving voltage for the second inspection ST. The discharge circuit 150 includes a discharge line DCL, a first discharge switching device DT1 and a second discharge switching device DT2. The discharge line DCL receives the second driving voltage Voff. The first discharge switching device DT1 is electrically connected to the discharge line DCL and the odd-numbered gate lines GL1 and GL3, and the second discharge switching device DT2 is electrically connected to the discharge line DCL and the even-numbered gate lines GL2 and GL4. More particularly, a drain electrode of the first discharge switching device DT1 is electrically connected to the first gate line GL1 or the third gate line GL3, a gate electrode of the first discharge switching device DT1 (DT1-1) is electrically connected to the even-numbered gate lines GL2 and GL4 of a next stage, and a source electrode of the first discharge switching device DT1 is electrically connected to the discharge line DCL.

A drain electrode of the second switching device DT2 is electrically connected to the second gate line GL2 or the fourth gate line GL4, a gate electrode of the second discharge switching device DT2 is electrically connected to the odd-numbered gate lines GL1 and GL3 of the next stage, and a source electrode of the second discharge switching device DT2 is electrically connected to the discharge line DCL. The second driving voltage Voff is applied to the discharge line DCL during the first and second inspections FT and ST. The second discharge switching device DT2 outputs the second driving voltage Voff to the even-numbered gate lines GL2 and GL4 in response to the first driving voltage Von applied to the odd-numbered gate lines GL1 and GL3 during the first inspection FT. Thus, the even-numbered pixels connected to the even-numbered gate lines GL2 and GL4 are turned off in response to the second driving voltage Voff. In response to the first driving voltage Von applied to the even-numbered gate lines GL2 and GL4, the first discharge switching device DT1 outputs the second driving voltage Voff to the odd-numbered gate lines GL1 and GL3 during the second inspection ST. Thus, the odd-numbered pixels connected to the odd-numbered gate lines GL1 and GL3 are turned off in response to the second driving voltage Voff.

As described above, electrical defects between the pixel 113 and an adjacent pixel may be detected since the odd-numbered gate lines GL1 to GL2n−1 and the even-numbered gate lines GL2 to GL2n are inspected during a different time from each other after classified the gate lines GL1, GL2, GL3 and GL4 into the odd-numbered gate lines GL1 to GL2n−1 and the even-numbered gate lines GL2 to GL2n. As a result, the array substrate 101 may be easily and accurately inspected. Further, the inspecting circuit 140 is electrically connected to the first end EP1 of the gate lines GL1 to GL2n, so that the array substrate 101 may reduce an electrostatic potential or charge applied to the gate lines GL1 to GL2n induced through the first end EP1. Thus, damage to the gate lines GL1 to GL2n, including open or short circuit, due to the electrostatic potential may be prevented. In the present embodiment, the gate driving circuit 130, the inspecting circuit 140 and the discharge circuit 150 are formed along with the pixels 113 formed in the pixel part 120. The gate driving circuit 130, the inspecting circuit 140 and the discharge circuit 150 include amorphous silicon thin film transistors as the switching devices.

Figure 4:
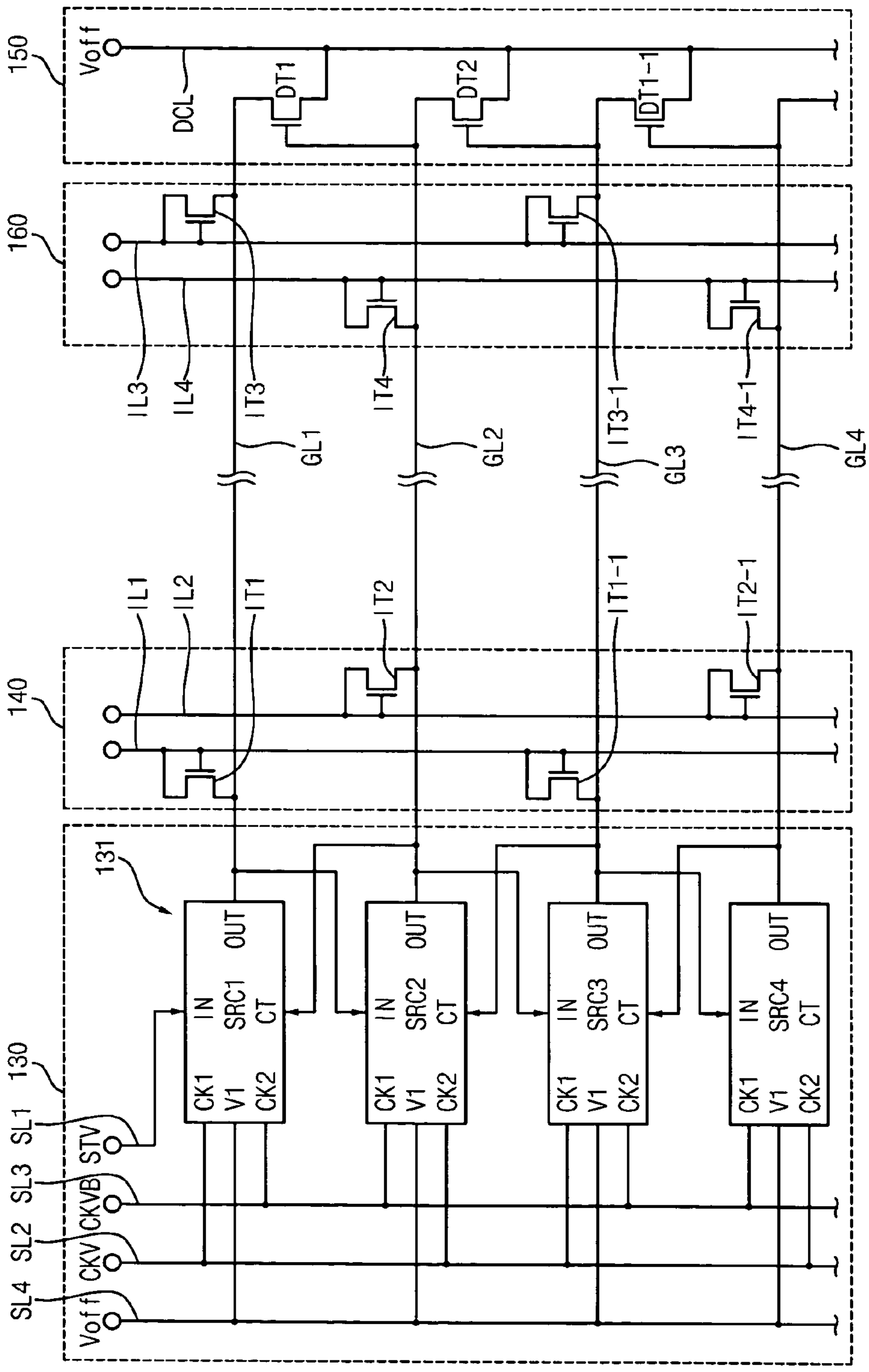
FIG. 4 is a circuit diagram showing an array substrate according to another exemplary embodiment of the present invention.

FIG. 4 is a circuit diagram showing an array substrate according to another exemplary embodiment of the present invention. Referring now to FIG. 4, an array substrate according to another exemplary embodiment of the present invention further includes a dummy inspecting circuit 160. The dummy inspecting circuit 160 is electrically connected to the second end EP2 of the gate lines GL1, GL2, GL3 and GL4, as shown in FIG. 1 and includes a third inspecting line IL3, a fourth inspecting line IL4 and a third switching device IT3. The third and fourth inspecting lines IL3 and IL4 extend in a substantially perpendicular direction to the first, second, third and fourth gate lines GL1, GL2, GL3 and GL4 and are insulated from the first, second, third and fourth gate lines GL1, GL2, GL3 and GL4. The third switching device IT3 is electrically connected to the third inspecting line IL3 and the fourth switching device IT4 is electrically connected to the fourth inspecting line IL4. The third switching device IT3 is electrically connected to the second end EP2 of the odd-numbered gate lines GL1 and GL3 of the first to fourth gate lines GL1 to GL4, as shown in FIG. 1. The fourth switching device IT4 is electrically connected to the second end EP2 of the even-numbered gate lines GL2 and GL4 of the first to fourth gate lines GL1 to GL4. More particularly, a gate electrode and a drain electrode of third switching device IT3 (IT3-1) are electrically connected to the third inspecting line IL3, and a source electrode is electrically connected to the first gate line GL1 or the third gate line GL3. A gate electrode and a drain electrode of the fourth switching device IT4 (IT4-1) are electrically connected to the fourth gate line IL4, and a source electrode is electrically connected to the second gate line GL2 or the fourth gate line GL4.

The dummy inspecting circuit 160 applies the first driving voltage Von or the second driving voltage Voff to the pixel part through the second end EP2 of the first to fourth gate lines GL1 to GL4 so as to inspect any defects of the pixel part. The dummy inspecting circuit 160 is to inspect the gate lines GL1, GL2, GL3 and GL4 in the event that the inspecting circuit 140 connected to the first end EP1 of the gate lines GL1, GL2, GL3 and GL4 malfunctions. That is, the array substrate 101 may provide redundancy since the dummy inspecting circuit 160 is also formed on the array substrate 101.

Figure 5:
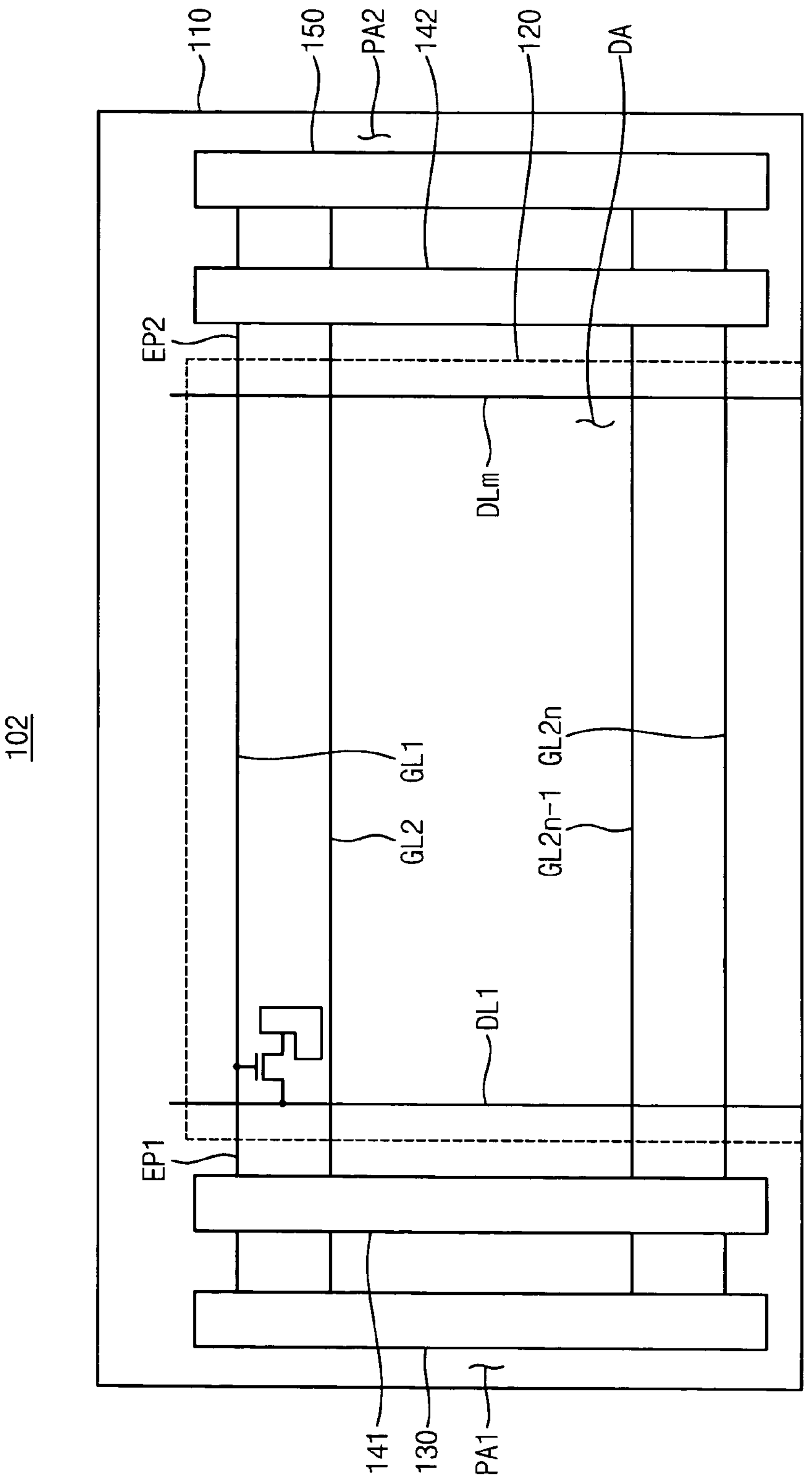
FIG. 5 is a plan view showing an array substrate according to another exemplary embodiment of the present invention.
Figure 6:
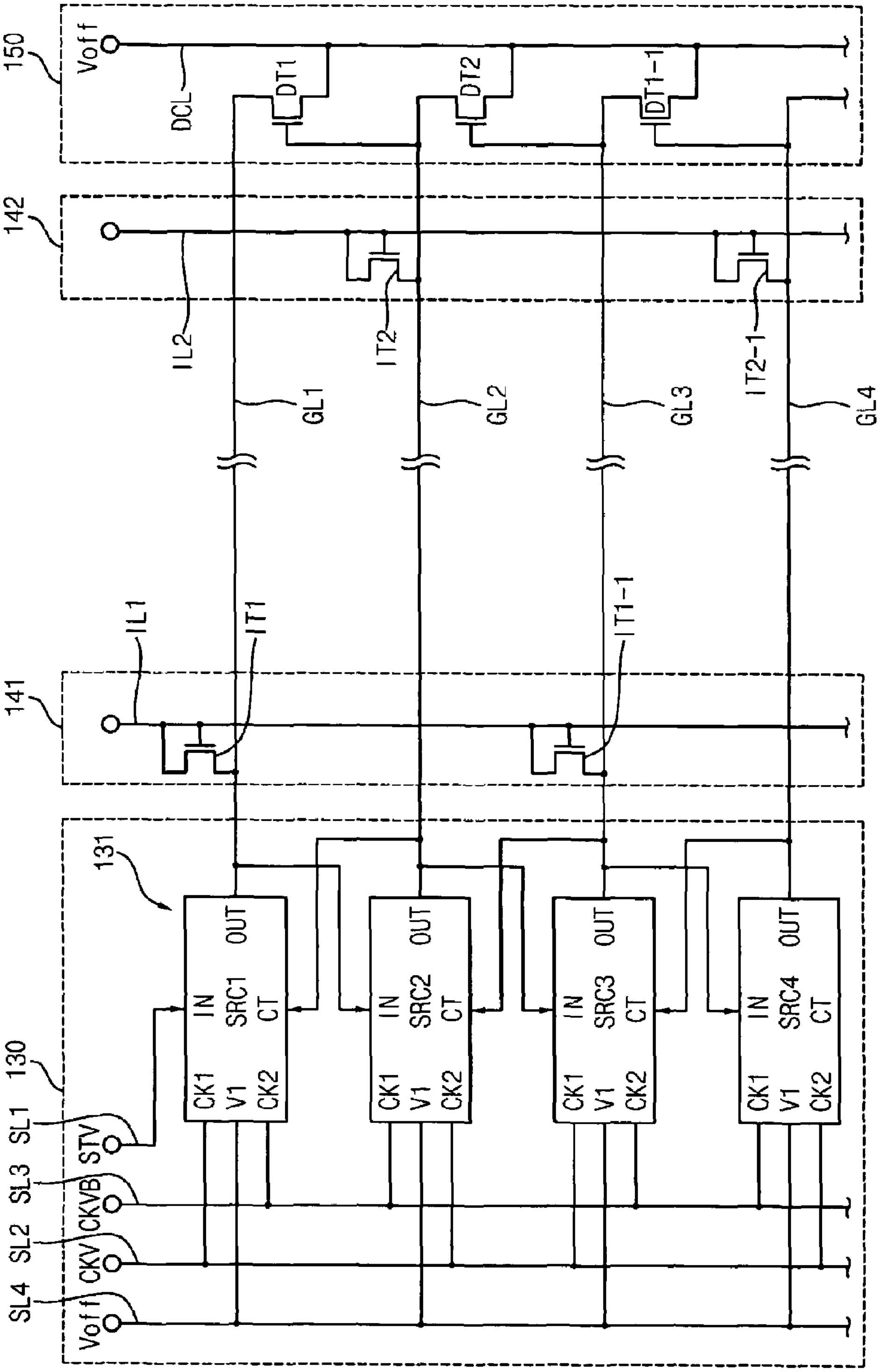
FIG. 6 is a circuit diagram showing a gate driving circuit, inspecting circuits, and a discharge circuit according to the exemplary embodiment of FIG. 5.

FIG. 5 is a plan view showing an array substrate according to another exemplary embodiment of the present invention, while FIG. 6 is a circuit diagram showing a gate driving circuit 130, inspecting circuits (141, 142), and a discharge circuit 150 according to the exemplary embodiment of FIG. 5. Referring now to FIG. 5, an array substrate 102 includes a substrate 110, a pixel part 120, a gate driving circuit 130, a first inspecting circuit 141, a second inspecting circuit 142 and a discharge circuit 150. The substrate 110 includes a display area DA, a first peripheral area PA1 and a second peripheral area PA2. The substrate 110 includes a pixel part 120 formed in the display area DA. The pixel part 120 includes first to 2n-th gate lines GL1 to GL2n, first to m-th gate lines DL1 to DLm and a plurality of pixels 113. The first peripheral area PA1 is adjacent to a first end EP1 of the first to 2n-th gate lines GL1 to GL2n. The gate driving circuit 130 and the first inspecting circuit 141 are formed in the first peripheral area PA1.

The first inspecting circuit 141 is electrically connected to the first end EP1 of odd-numbered gate lines GL1 to GL2n−1 of the first to 2n-th gate lines GL1 to GL2n. As shown in FIG. 6, the first inspecting circuit 141 includes a first inspecting line IL1 and a first switching device IT1. The first inspecting line IL1 receives the first driving voltage during a first inspection of which the odd-numbered gate lines GL1 to GL2n−1 are inspected. Thus, odd-numbered pixels connected to the odd-numbered gate lines GL1 to GL2n−1 are turned on in response to the first driving voltage during the first inspection.

The second peripheral area PA2 is adjacent to a second end EP2 of the first to 2n-th gate lines GL1 to GL2n. The second inspecting circuit 142 and the discharge circuit 150 are formed in the second peripheral area PA2. The second inspecting circuit 142 is electrically connected to the second end EP2 of even-numbered gate lines GL2 to GL2n of the first to 2n-th gate lines GL1 to GL2n. As shown in FIG. 6, the second inspecting circuit 142 includes a second inspecting line IL2 and a second switching device IT2. The second inspecting line IL2 receives the first driving voltage during a second inspection in which the even-numbered gate lines GL2 to GL2n are inspected. Thus, even-numbered pixels connected to the even-numbered gate lines GL2 to GL2n are turned on in response to the first driving voltage during the second inspection. The gate driving circuit 130, the pixel part 120, the first and second inspecting circuits (141, 142), and the discharge circuit 150 include amorphous silicon thin film transistors as the switching devices.

As described above, the inspecting circuit 140 for the gate lines GL1 to GL2*n* may be classified into the first inspecting circuit 141 for the odd-numbered gate lines GL1 to GL2n−1 and the second inspecting circuit 142 for the even-numbered gate lines GL2 to GL2n. Further, the first and second inspecting circuits 141 and 142 may be spaced apart from each other since the first and second inspecting circuits 141 and 142 are formed at both ends of the gate lines GL1 to GL2n, respectively.

Figure 7:
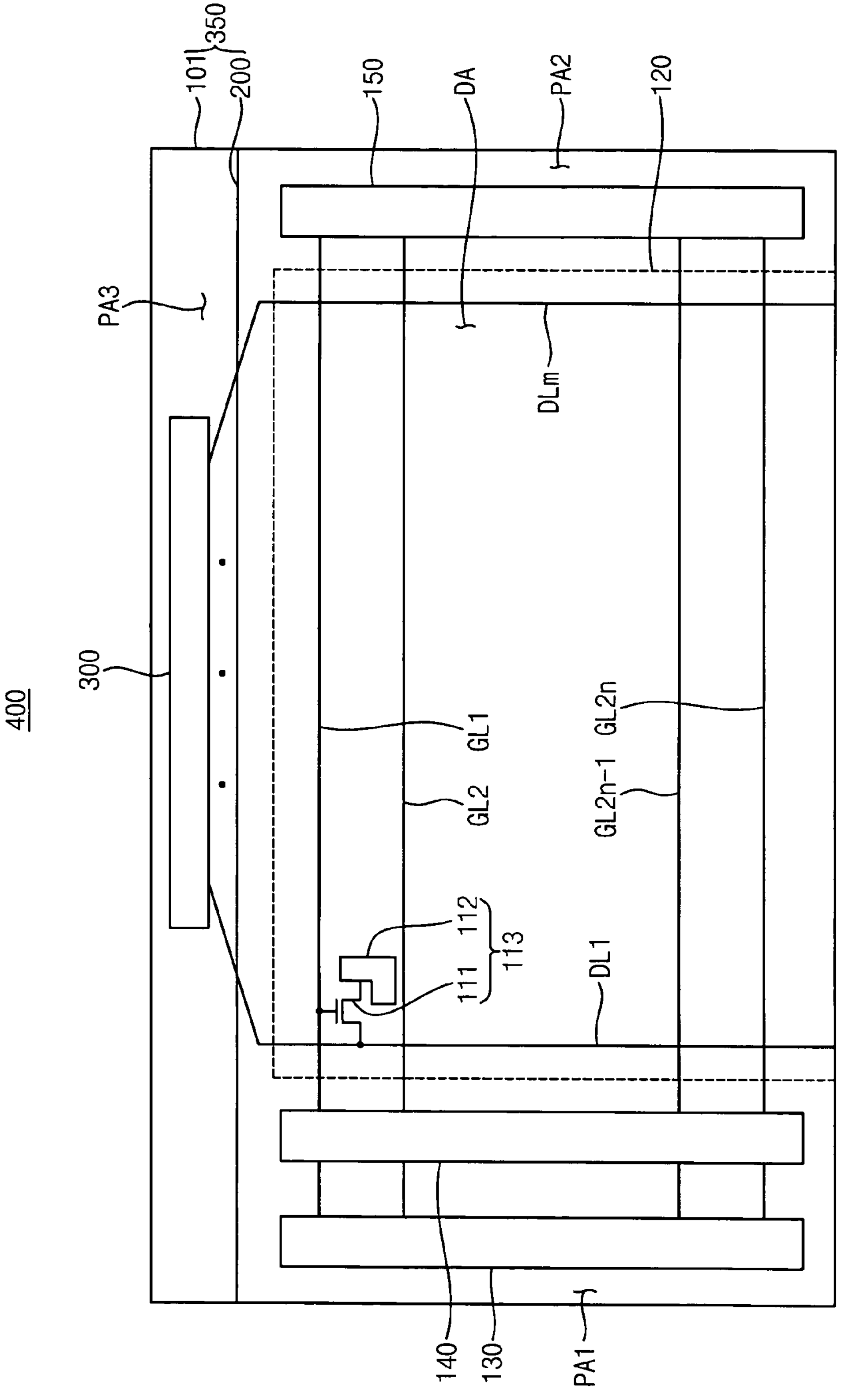
FIG. 7 is a plan view showing a display apparatus according to another exemplary embodiment of the present invention.

FIG. 7 is a plan view showing a display apparatus according to another exemplary embodiment of the present invention. Referring now to FIG. 7, a display apparatus 400 includes a display panel 350 that displays an image. The display panel 350 includes an array substrate 101, a color filter substrate 200 facing the array substrate 101, and a liquid crystal layer (not shown) disposed between the array substrate 101 and the color filter substrate 200. The color filter substrate 200 comprises one embodiment of an opposite substrate. That is, an opposite substrate is one that is disposed opposite from and coupled to the array substrate 101. The array substrate 101 further includes a third peripheral area PA3 adjacent to an end of the first to the m-th data lines DL1 to DLm. The array substrate 101 includes a data driving circuit 300 formed in the third peripheral area PA3 so as to apply data signals to each of the first to the m-th data lines DL1 to DLm. The data driving circuit 300 can be formed as an integrated circuit chip and mounted on the peripheral area PA3 of the array substrate 101. Although not shown in FIG. 7, the color filter substrate 200 includes a color filter layer having red, green and blue color pixels and a common electrode facing the pixel electrode 112 formed on the array substrate 101.

According to the array substrate and the display apparatus, the array substrate includes the first and second inspecting circuits that inspect the odd-numbered gate lines and the even-numbered gate lines, respectively. Thus, electrical defects between the pixels may be easily detected, thereby improving the inspectability for the defects of the array substrate. Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An array substrate, comprising:

a substrate member;

a pixel part having a plurality of gate lines, a plurality of data lines and a plurality of pixels electrically connected to the gate lines and data lines, the pixel part being formed on the substrate member, the gate lines including odd-numbered gate lines and even-numbered gate lines, the pixels including odd-numbered pixels and even-numbered pixels;

a gate driving circuit electrically connected to a first end of the gate lines and formed on the substrate member adjacent to the pixel part so as to apply a gate signal to the gate lines;

a first inspecting circuit electrically connected to the odd-numbered gate lines so as to inspect odd-numbered pixels connected to the odd-numbered gate lines, the first inspecting circuit comprising a first switching device electrically connected to the odd-numbered gate lines and a first inspecting line configured to apply a first driving voltage to the first switching device during a first inspection operation in which the odd-numbered gate lines are inspected, the first inspecting line being electrically connected to the first switching device; and a second inspecting circuit electrically connected to the even-numbered gate lines so as to inspect even-numbered pixels connected to the even-numbered gate lines, the second inspecting circuit comprises: a second switching device electrically connected to the even-numbered gate lines and a second inspecting line configured to apply the first driving voltage to the second switching device during a second inspection operation in which the even-numbered gate lines are inspected, the second inspecting line being electrically connected to the second switching device.

2. The array substrate of claim 1, wherein the first switching device comprises a first electrode connected to the first inspecting line, a second electrode connected to the first inspecting line and a third electrode connected to the odd-numbered gate lines, and the first switching device applies the first driving voltage to the odd-numbered gate lines during the first inspection.

3. The array substrate of claim 1, wherein the second switching device comprises a first electrode connected to the second inspecting line, a second electrode connected to the second inspecting line and a third electrode connected to the even-numbered gate lines, and the second switching device applies the first driving voltage to the even-numbered gate lines during the second inspection.

4. The array substrate of claim 1, wherein a second driving voltage is applied to the first inspecting line and the first switching device is turned off in response to the second driving voltage during the second inspection, and the second driving voltage is applied to the second inspecting line and the second switching device is turned off in response to the second driving voltage during the first inspection.

5. The array substrate of claim 1, further comprising a discharge circuit electrically connected to the gate lines adapted to discharge the gate lines.

6. The array substrate of claim 5, wherein the discharge circuit comprises:

a discharge line receives a second driving voltage;

a first discharge switching device of which a first electrode is connected to the discharge line, a second electrode is connected to the odd-numbered gate lines, and a third electrode is connected to the even-numbered gate lines; and a second discharge switching device of which a first electrode is connected to the discharge line, a second electrode is connected to the even-numbered gate lines, and a third electrode is connected to the odd-numbered gate lines.

7. The array substrate of claim 6, wherein the second driving voltage is applied to the discharge line during the first and second inspections, the second discharge switching device applies the second driving voltage from the discharge line to the even-numbered gate lines in response to the first driving voltage applied to the odd-numbered gate lines during the first inspection, and the first discharge switching device applies the second driving voltage from the discharge line to the odd-numbered gate lines in response to the first driving voltage applied to the even-numbered gate lines during the second inspection.

8. The array substrate of claim 1, wherein the first and second inspecting circuits are disposed on the substrate member between the pixel part and the gate driving circuit, and electrically connected to first ends of the odd-numbered gate lines and the even-numbered gate lines.

9. The array substrate of claim 8, further comprising:

a dummy inspecting circuit electrically connected to second ends of the odd-numbered gate lines, the dummy inspecting circuit comprising:

a third switching device electrically connected to the odd-numbered gate lines;

a third inspecting line to apply a first driving voltage to the third switching device during a first inspection of which the odd-numbered gate lines are inspected, the third inspecting line being electrically connected to the third switching device, and a fourth switching device electrically connected to the even-numbered gate lines; and a fourth inspecting line to apply the first driving voltage to the fourth switching device during a second inspection of which the even-numbered gate lines are inspected, the fourth inspecting line being electrically connected to the fourth switching device.

10. The array substrate of claim 9, wherein the third switching device comprises a first electrode connected to the third inspecting line, a second electrode connected to the third inspecting line and a third electrode electrically connected to a second end of the odd-numbered gate lines, and the third switching device applies the first driving voltage to the odd-numbered gate lines during the first inspection.

11. The array substrate of claim 10, wherein the fourth switching device comprises a first electrode connected to the fourth inspecting line, a second electrode connected to the fourth inspecting line and a third electrode electrically connected to a second end of the even-numbered gate lines, and the fourth switching device applies the first driving voltage to the even-numbered gate lines during the second inspection.

12. The array substrate of claim 10, wherein the first inspecting line receives a second driving voltage and the third switching device is turned off in response to the second driving voltage during the second inspection, and the second inspecting line receives the second driving voltage and the fourth switching device is turned off in response to the second driving voltage during the first inspection.

13. The array substrate of claim 8, wherein the first and second inspecting circuits reduce an electrostatic potential induced through the gate driving circuit.

14. The array substrate of claim 1, wherein the gate driving circuit is formed with the pixels on the substrate member by a same process as that of the pixels.

15. The array substrate of claim 1, wherein the gate driving circuit, the pixel part, and the first and second inspecting circuits comprise an amorphous silicon thin film transistor as a switching device.

16. The array substrate of claim 1, wherein the first inspecting circuit is disposed on the substrate corresponding to an area between the pixel part and the inspecting circuit and electrically connected to a first end of the odd-numbered gate lines, and the second inspecting circuit is electrically connected to a second end of the even-numbered gate lines.

* * * * *